(12) United States Patent
Chang et al.

(10) Patent No.: US 12,740,170 B2
(45) Date of Patent: Sep. 15, 2026

(54) IMAGE SENSOR INCLUDING MULTI-SPECTRAL FILTER AND ELECTRONIC DEVICE INCLUDING THE IMAGE SENSOR

(71) Applicant: SAMSUNG ELECTRONICS CO., LTD., Suwon-si (KR)

(72) Inventors: Hojun Chang, Suwon-si (KR); Junhyuk Moon, Suwon-si (KR); Youngho Jung, Suwon-si (KR); Kyungwook Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 331 days.

(21) Appl. No.: 18/519,820

(22) Filed: Nov. 27, 2023

(65) Prior Publication Data

US 2024/0178248 A1 May 30, 2024

(30) Foreign Application Priority Data

Nov. 28, 2022 (KR) ........................ 10-2022-0162033

(51) Int. Cl.
*H10F 39/00* (2025.01)
*H10F 39/18* (2025.01)

(52) U.S. Cl.
CPC ....... *H10F 39/8053* (2025.01); *H10F 39/182* (2025.01); *H10F 39/8063* (2025.01)

(58) Field of Classification Search
CPC ............... H10F 39/182; H10F 39/8053; H10F 39/8063; H10F 39/011; H10F 39/184;
(Continued)

(56) References Cited

U.S. PATENT DOCUMENTS 8,446,470 B2 5/2013 Lu et al.
8,872,093 B2 10/2014 Lee et al.
(Continued)

FOREIGN PATENT DOCUMENTS

EP 3 633 334 A1 4/2020
KR 10-2021-0070801 A 6/2021
(Continued)

OTHER PUBLICATIONS

"What's inside the Apple iphone 13 Pro Teardown?," Apple iphone 13 Pro Teardown | TechInsights, https://www.techinsights.com/ko/node/34621, downloaded Feb. 24, 2023, Total 15 pages.
(Continued)

*Primary Examiner* — Mouloucoulaye Inoussa
(74) *Attorney, Agent, or Firm* — Sughrue Mion, PLLC

(57) ABSTRACT

An image sensor includes: a light filter; and a light detector that includes a plurality of pixels disposed on a lower portion of the light filter, the light detector being configured to detect light transmitted through the light filter. The light filter includes: a color filter that includes a plurality of red filters, a plurality of green filters, and a plurality of blue filters. The light filter includes: a plurality of multi-spectral filters disposed adjacent to and coplanar with the color filter, each of the plurality of multispectral filters including a plurality of band filters configured to transmit light in different wavelength bands. Each of the plurality of band filters is configured to transmit light in a band filter wavelength range that is narrower than a wavelength range of the plurality of red filters, the plurality of green filters and the plurality of blue filters.

22 Claims, 24 Drawing Sheets

(58) Field of Classification Search

CPC ..... H10F 39/806; G01J 3/0254; G01J 3/0262; G01J 3/2803; G01J 1/0437; G01J 3/2823; G01J 3/0208; G01J 3/0205; G01J 1/0429; G01J 1/0411; G01J 2003/1213; G01J 2003/2826; G02B 5/201; H04N 23/11; H04N 23/88; H04N 25/46; H04N 23/951; H04N 23/843; H04N 25/44; H04N 25/134; H04N 2209/042; G06T 3/4015

See application file for complete search history.

(56) References Cited

U.S. PATENT DOCUMENTS

| | | | | |
|---|---|---|---|---|
| 9,188,480 | B2 | 11/2015 | Tanaka et al. | |
| 9,857,222 | B2 | 1/2018 | Geelen et al. | |
| 10,735,699 | B1 | 8/2020 | Chan et al. | |
| 2009/0200451 | A1* | 8/2009 | Conners | H04N 25/135 250/226 |
| 2018/0013962 | A1* | 1/2018 | Chang | G02B 5/201 |
| 2018/0152633 | A1* | 5/2018 | Wei | H04N 23/88 |
| 2018/0152646 | A1* | 5/2018 | Tang | H04N 25/46 |
| 2018/0152647 | A1* | 5/2018 | Tang | H04N 23/88 |
| 2018/0266878 | A1 | 9/2018 | Jacobs et al. | |
| 2020/0021782 | A1* | 1/2020 | Sugizaki | H10F 39/182 |
| 2020/0328239 | A1* | 10/2020 | Yen | H10F 39/182 |
| 2020/0358971 | A1* | 11/2020 | Shim | H10F 39/813 |
| 2021/0033466 | A1 | 2/2021 | Kim et al. | |
| 2021/0191141 | A1* | 6/2021 | Park | G01J 3/26 |
| 2022/0124264 | A1* | 4/2022 | Jang | H04N 25/46 |
| 2022/0128407 | A1* | 4/2022 | Lee | G02B 5/201 |
| 2022/0132079 | A1* | 4/2022 | Choi | H04N 25/78 |
| 2022/0141438 | A1 | 5/2022 | Osadchiy et al. | |
| 2022/0149098 | A1 | 5/2022 | Wang et al. | |
| 2022/0262784 | A1 | 8/2022 | Hwang et al. | |
| 2022/0264032 | A1 | 8/2022 | Yoon et al. | |
| 2022/0293653 | A1* | 9/2022 | Moon | H10F 39/8053 |
| 2023/0098924 | A1* | 3/2023 | Lee | H10F 39/807 348/272 |
| 2024/0230402 | A1* | 7/2024 | Mann | G01J 3/0254 |

FOREIGN PATENT DOCUMENTS

| | | | |
|---|---|---|---|
| KR | 10-2022-0060966 | A | 5/2022 |
| WO | 2008/097705 | A1 | 8/2008 |

OTHER PUBLICATIONS

Communication dated Mar. 20, 2026 issued by the Korean Ministry of Intellectual Property in Korean Patent Application No. 10-2022-0162033.

* cited by examiner

IMAGE SENSOR INCLUDING MULTI-SPECTRAL FILTER AND ELECTRONIC DEVICE INCLUDING THE IMAGE SENSOR

CROSS-REFERENCE TO RELATED APPLICATION

This application is based on and claims priority under 35 U.S.C. § 119 to Korean Patent Application No. 10-2022-0162033, filed on Nov. 28, 2022, in the Korean Intellectual Property Office, the disclosure of which is incorporated by reference herein in its entirety.

BACKGROUND

1. Field

The present disclosure relates to an image sensor including a multi-spectral filter and an electronic device including the image sensor.

2. Description of the Related Art

A spectral filter is used in a color representation technique for a display device as well as a light receiving element such as a complementary metal oxide semiconductor (CMOS) image sensor.

Specifically, in addition to a color filter based on an RGB filter, a color filter having a narrower wavelength bandwidth (i.e., a bandpass filter) is used as an ambient light sensor. Light sensors are used to automatically adjust the brightness of an original display, and are recently used in camera modules that include image sensors.

In a conventional image sensor, a wavelength band is classified into only three sections of red (R), green (G), and blue (B). Specifically, the CMOS image sensor device in which a cluster including a multi-spectral filter is integrated has an effect of not being different from a multi-spectral filter image sensor in which a plurality of color filters (bandpass filters) are integrated. Accordingly, in order to improve the color representation accuracy and object recognition performance, it is desirable to develop an image sensor having a spectral filter that transmits light by dividing a wavelength band into more sections.

SUMMARY

Provided are an image sensor including a multi-spectral filter and an electronic device including the image sensor.

Additional aspects will be set forth in part in the description which follows and, in part, will be apparent from the description, or may be learned by practice of the presented embodiments of the disclosure.

An image sensor may include: a light filter; and a light detector that includes a plurality of pixels disposed on a lower portion of the light filter, the light detector being configured to detect light transmitted through the light filter. The light filter may include: a color filter that includes a plurality of red filters, a plurality of green filters, and a plurality of blue filters. The light filter may include: a plurality of multi-spectral filters disposed adjacent to and coplanar with the color filter, each of the plurality of multispectral filters including a plurality of band filters configured to transmit light in different wavelength bands. Each of the plurality of band filters may be configured to transmit light in a band filter wavelength range that is narrower than a wavelength range of the plurality of red filters, the plurality of green filters and the plurality of blue filters.

The light detector may include a complementary metal oxide semiconductor (CMOS) device.

The color filter and the plurality of multi-spectral filters may be disposed adjacent to and coplanar with the light detector across a cross-section of the image sensor.

The plurality of multi-spectral filters may be integrally provided with the color filter as a monolithic structure or may be hetero-bonded to the color filter.

Each of the multi-spectral filters may include eight to sixteen band filters which are configured to transmit light in different wavelength bands within a visible light wavelength region.

The plurality of band filters of each of the plurality of multi-spectral filters may be arranged in a 4×4 matrix or 3×3 matrix.

The color filter and a first subset of the plurality of pixels that correspond to pixels disposed on a lower portion of the color filter may form a color image sensor. Each of the plurality of multi-spectral filters and a second subset of the plurality of pixels that correspond to pixels disposed on a lower portion of each of the plurality of multi-spectral filters may form a multi-spectral image sensor.

The color image sensor may be configured to acquire image information by detecting light transmitted through the color filter. The multi-spectral image sensor may be configured to acquire ambient light information around the multi-spectral filter by detecting light transmitted through the multi-spectral filter.

The multi-spectral image sensor may be configured to be used to optimize a color matrix by performing calibration based on the ambient light information.

An electronic device may include an image sensor including: a light filter, and a light detector that includes a plurality of pixels disposed on a lower portion of the light filter, the light detector being configured to detect light transmitted through the light filter. The electronic device may include a processor configured to correct image information acquired by the image sensor. The light filter may include: a color filter that includes a plurality of red filters, a plurality of green filters, and a plurality of blue filters. The light filter may include: a plurality of multi-spectral filters disposed adjacent to and coplanar with the color filter, each of the plurality of multispectral filters including a plurality of band filters configured to transmit light in different wavelength bands. Each of the plurality of band filters may be configured to transmit light in a band filter wavelength range that is narrower than a wavelength range of the plurality of red filters, the plurality of green filters and the plurality of blue filters.

The color filter and a first subset of the plurality of pixels that correspond to pixels disposed on a lower portion of the color filter may form a color image sensor. Each of the plurality of multi-spectral filters and a second subset of the plurality of pixels that correspond to pixels disposed on a lower portion of each of the plurality of multi-spectral filters may form a multi-spectral image sensor.

The color image sensor may be configured to acquire the image information by detecting light transmitted through the color filter. The multi-spectral image sensor may be configured to acquire ambient light information around the multi-spectral filter by detecting light transmitted through the multi-spectral filter.

The processor may be configured to optimize a color matrix by performing calibration based on the ambient light information acquired by the multi-spectral image sensor.

The processor being configured to correct the image information acquired by the image sensor may include being configured to correct the image information acquired by the color image sensor by using the optimized color matrix.

The light detector may include a complementary metal oxide semiconductor (CMOS) device.

The color filter and the plurality of multi-spectral filters may be disposed adjacent to and coplanar with the light detector across a cross-section of the image sensor.

The plurality of multi-spectral filters may be integrally provided with the color filter as a monolithic structure or may be hetero-bonded to the color filter.

Each of the multi-spectral filters may include eight to sixteen band filters which are configured to transmit light in different wavelength bands within a visible light wavelength region.

The plurality of band filters of each of the plurality of multi-spectral filters may be arranged in a 4×4 matrix or 3×3 matrix.

An image sensor may include: a light filter; a microlens array disposed on an upper portion of the light filter; and a light detector that comprises a plurality of pixels disposed on a lower portion of the light filter, the light detector being configured to detect light transmitted through the light filter. The light filter may include: a color filter that includes a plurality of red filters, a plurality of green filters, and a plurality of blue filters. The light filter may include: a plurality of multi-spectral filters disposed adjacent to and coplanar with the color filter, each of the plurality of multispectral filters including a plurality of band filters configured to transmit light in different wavelength bands. Each of the plurality of band filters may be configured to transmit light in a band filter wavelength range that is narrower than a wavelength range of the plurality of red filters, the plurality of green filters and the plurality of blue filters. The plurality of pixels may include a plurality of light detection cells configured to convert incident light concentrated by the microlens array into an electrical signal.

The plurality of light detection cells may include a first light detection cell, a second light detection cell, a third light detection cell, and a fourth light detection cell arranged in a 2×2 array. The plurality of light detection cells configured to convert the incident light concentrated by the microlens array into the electrical signal may include the first light detection cell, the second light detection cell, the third light detection cell, and the fourth light detection cell being configured to convert the incident light into the electrical signal corresponding to a first sub-pixel, a second sub-pixel, a third sub-pixel, and a fourth sub-pixel respectively. The microlens array may include a first microlens, a second microlens, a third microlens, and fourth microlens that may be respectively configured to concentrate the incident light on the first light detection cell, the second light detection cell, the third light detection cell, and the fourth light detection cell.

The light detector may be a silicon based photodiode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
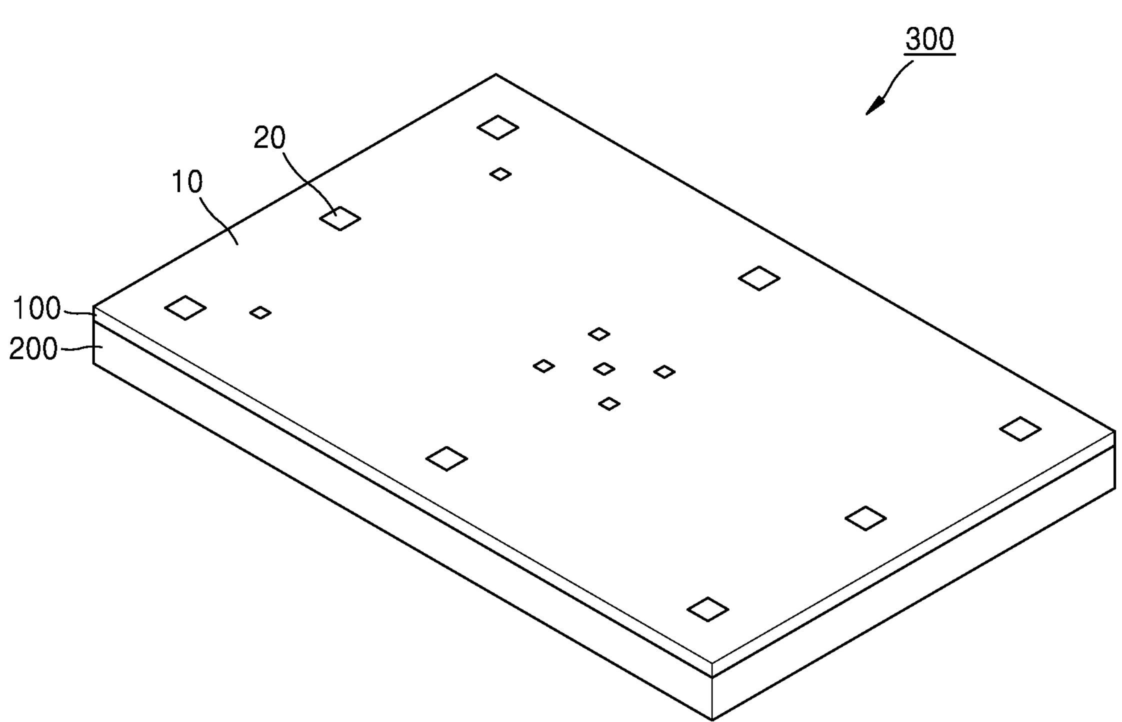
FIG. 1 is a perspective view illustrating an image sensor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. In the following drawings, the same reference numerals refer to the same components, and the size of each component in the drawings may be exaggerated for clarity and convenience of description. Meanwhile, embodiments described below are merely illustrative, and various modifications are possible from these embodiments.

Hereinafter, the term "upper portion" or "on" may also include "to be present on the top, bottom, left or right portion on a non-contact basis" as well as "to be present just on the top, bottom, left or right portion in directly contact with". Singular expressions include plural expressions unless the context clearly means otherwise. In addition, when a part "contains" a component, this means that it may contain other components, rather than excluding other components, unless otherwise stated.

The use of the term "the" and similar indicative terms may correspond to both singular and plural. Unless there is clear order or contrary description of the steps constituting the method, these steps may be performed in the appropriate order, and are not necessarily limited to the order described.

Further, the terms "unit", "module" or the like mean a unit that processes at least one function or operation, which may be implemented in hardware or software or implemented in a combination of hardware and software.

The connection or connection members of lines between the components shown in the drawings exemplarily represent functional connection and/or physical or circuit connections, and may be replaceable or represented as various additional functional connections, physical connections, or circuit connections in an actual device.

The use of all examples or illustrative terms is simply to describe technical ideas in detail, and the scope is not limited due to these examples or illustrative terms unless the scope is limited by the claims.

FIG. 1 is a perspective view illustrating an image sensor according to an embodiment.

Referring to FIG. 1, the image sensor 300 may include a light filter 100 and a light detector 200. A color filter 10 and a multi-spectral filter 20 may be arranged on the light filter 100. The color filter 10 and the multi-spectral filter 20 may be arranged on a co-plane, and may be arranged side by side or spaced apart from each other on the co-plane.

Figure 2A:
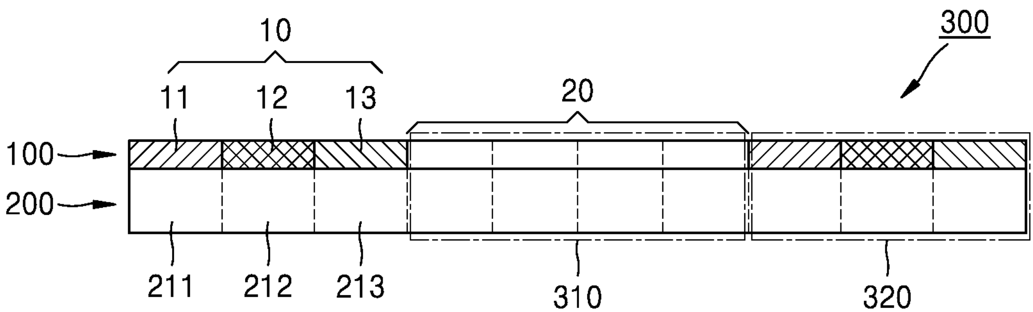
FIG. 2A is a cross-sectional view of an image sensor according to an embodiment.

The color filter 10 and multiple pixels placed under the color filter may be combined to form a color image sensor 320 (see FIG. 2A), and a multi-spectral filter 20 and multiple pixels placed under the multi-spectral filter may be combined to form a multi-spectral image sensor 310 (see FIG. 2A).

The size of the multi-spectral image sensor 310 in which the multi-spectral filters 20 are clustered may be variously modified. In addition, the arrangement structure of the multi-spectral filter and the multi-spectral image sensor may be variously modified.

The light filter 100 may include a color filter 10 including a plurality of red, green, and blue filters.

The multi-spectral filter 20 may be arranged in parallel with the color filter 10, and the multi-spectral filter 20 may include a plurality of band filters transmitting light in different wavelength bands, respectively. Each band filter may be configured to transmit a narrower wavelength range than the wavelength ranges of the red, green, and blue filters, and a clear and sophisticated image may be obtained by transmitting a narrow wavelength range.

FIG. 2A is a cross-sectional view of an image sensor according to an embodiment.

Referring to FIG. 2A, the image sensor 300 may include the light filter 100 and the light detector 200 including a plurality of pixels 211, 212, and 213 arranged under the light filter 100 to detect light transmitted through the light filter 100.

The light filter 100 may include a plurality of the color filters 10 each including a red filter 11, a green filter 12, and a blue filter 13, and may include a plurality of multi-spectral filters 20 each including a plurality of band filters 21 that transmit light in different wavelength bands in which the plurality of band filters 21 are arranged in parallel with the color filters 10.

Each of the plurality of band filters 21 may transmit a wavelength range narrower than the wavelength ranges of the red filter 11, the green filter 12, and the blue filter 13.

In other words, the color filter 10 including the red filter 11, the green filter 12, and the blue filter 13 may transmit a wavelength range of a visible light region (400 nm or more and 700 nm or less), and the multi-spectral filter 20 including at least 8 and 16 or less band filters transmitting light in different wavelength bands may also transmit a wavelength range of a visible light region (400 nm or more and 700 nm or less), and each of the plurality of band filters may transmit a wavelength in a narrower range than the red filter 11, the green filter 12, and the blue filter 13.

When the color information and color coordinates of the acquired image are transmitted over a narrower and more detailed wavelength range, more accurate and diverse colors may be implemented.

The light detector 200 may be arranged under the light filter 100, and the color filter 10 and the plurality of multi-spectral filters 20, which are included in the light filter 100, may be arranged on a co-plane with the light detector 200 across a cross-section of the image sensor 300.

The plurality of multi-spectral filters 20 may be provided with the color filter 10 integrally formed therein or may be manufactured to be hetero-bonded to the color filter 10.

Specifically, the multi-spectral filter 20 may be directly implemented by a semiconductor process to be provided color filter 10 integrally formed therein.

Alternatively, a heterogeneous integration method in which a filter is manufactured externally and then bonded to an image sensor is possible in the case of a multi-spectral filter in which a III-V compound semiconductor or other material is used or an outsourced manufacturing process is involved. In some cases, various types of heterojunction methods may be selected in consideration of the die size and type of devices and multi-spectral filters, such as wafer-to-wafer bonding, laser bonding, polydimethylsiloxane (PDMS) transfer bonding, simple pick-and-place bonding, and fluidic self-assembly bonding.

The color filter 10 may include the plurality of the red filter 11, the green filter 12, and the blue filter 13, and the plurality of the red filter 11, the green filter 12, and the blue filter 13 may be arranged side by side on a co-plane together with the light detector 200 across a cross-section of the image sensor 300.

The light detector 200 may include, but is not limited to, a Complementary Metal Oxide Semiconductor (CMOS) device.

A CMOS device is a type of semiconductor device that allows both transistors to operate complementarily by bonding a MOS transistor of a p-channel and a transistor of an n-channel to be arranged in the same device.

The image sensor 300 may include the color image sensor 320 including the color filter 10 and a plurality of pixels arranged under the color filter 10, and the image sensor 300 may include the multi-spectral image sensor 310 including the multi-spectral filter 20 and a plurality of pixels arranged under the multi-spectral filter 20.

The color image sensor 320 may acquire image information by detecting light transmitted through the color filter 10, and the multi-spectral image sensor 310 may acquire ambient light information around the multi-spectral filter 20 by detecting light transmitted through the multi-spectral filter 20.

When photographing a target object and acquiring an image, if the ambient light changes, the color and color information of the acquired image may vary despite the same object and environment. For this reason, in order to measure the exact color information and color coordinates of an object, it is necessary to obtain a color matrix optimized for lighting at each location where the object is photographed.

A color matrix may be optimized by performing calibration based on at least one of the pieces of light information output from the plurality of multi-spectral image sensors 320.

The color matrix may be optimized to correct the captured image information, thereby obtaining a clearer and higher resolution image.

Figure 2B:
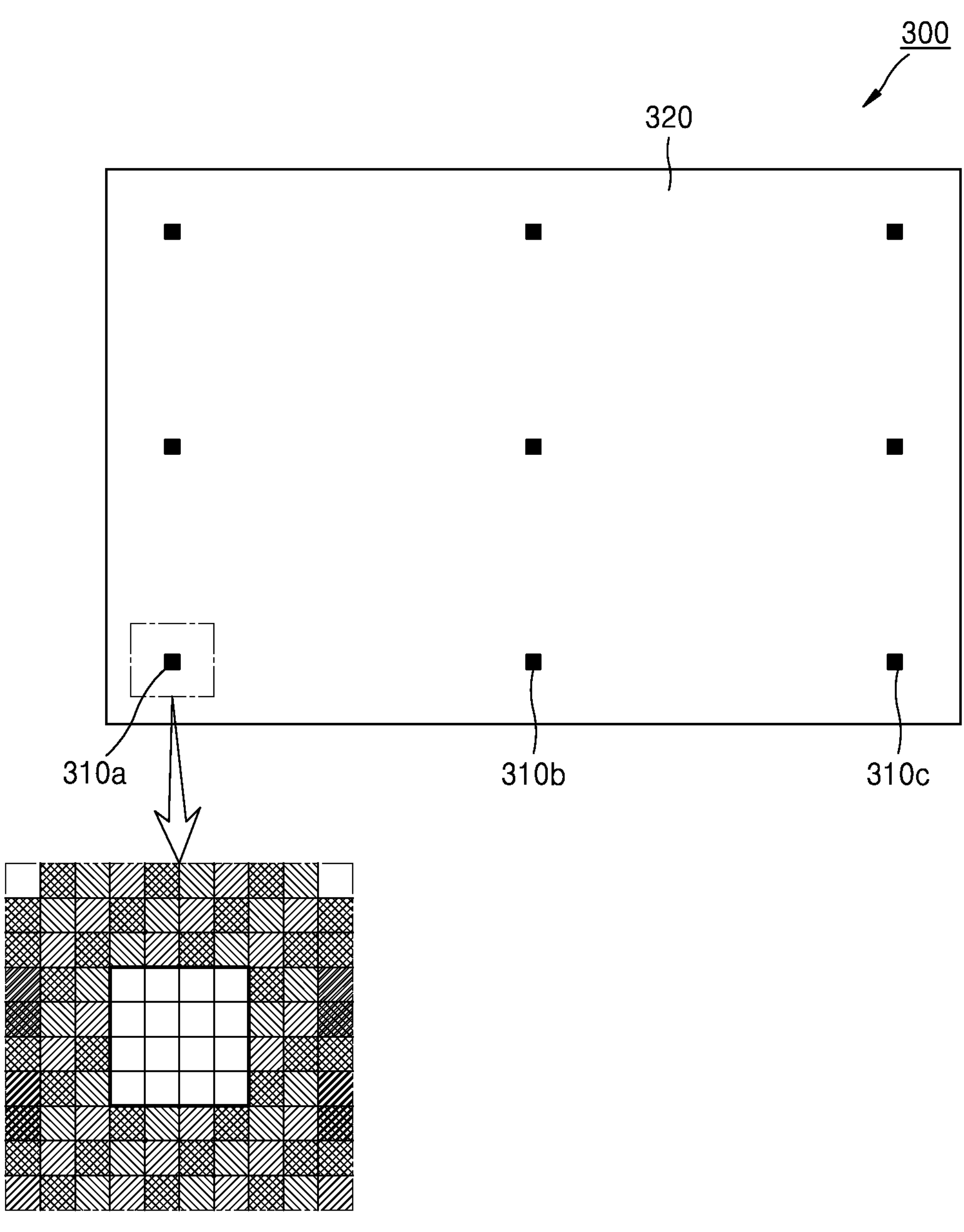
FIG. 2B is a diagram illustrating a multi-spectral image sensor and a color image sensor according to an embodiment.

FIG. 2B is a diagram illustrating a multi-spectral image sensor and a color image sensor according to an embodiment.

Referring to FIG. 2B, the image sensor 300 may include the color image sensor 320 and the multi-spectral image sensor 310. The multi-spectral image sensor 310 may be configured in a plural number, and may be arranged adjacent to the color image sensor 320.

As shown in FIG. 2B, the plurality of multi-spectral image sensors 310*a*, 310*b*, 310*c*, . . . may be uniformly arranged in a 3×3 form, but the embodiments are not limited thereto, and may also be configured in a 4×4 array or 5×5 array.

Figure 3:
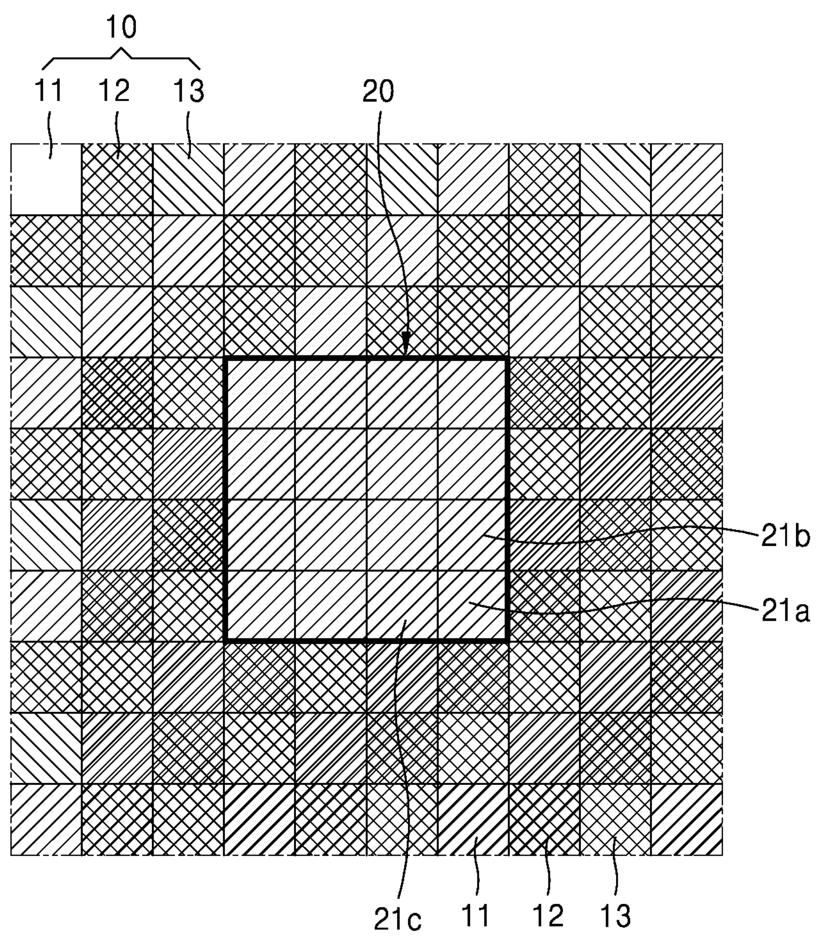
FIG. 3 is a plan view of a light filter according to an embodiment.

FIG. 3 is a plan view of a light filter according to an embodiment.

Referring to FIG. 3, when the light filter 100 is viewed from above, the color filter 10 and the multi-spectral filter 20 are arranged.

The arrangement of the color filter 10 is as described in FIG. 2A, and the multi-spectral filter 20 may include the plurality of band filters 21 that transmit light in different wavelength bands. The plurality of band filters 21 may include a first band filter 21*a*, a second band filter 21*b*, and a third band filter 21*c*, but this is merely an example and is not necessarily limited thereto.

In FIG. 3, each pixel of the multi-spectral filter 20 has a structure (for example, a structure arranged at a ratio of 1:1) configured to be the same as the size of a general color pixel (for example, a red-green-blue filter), but the embodiments are not necessarily limited thereto, and may be arranged in various ratios and shapes.

Figure 4A:
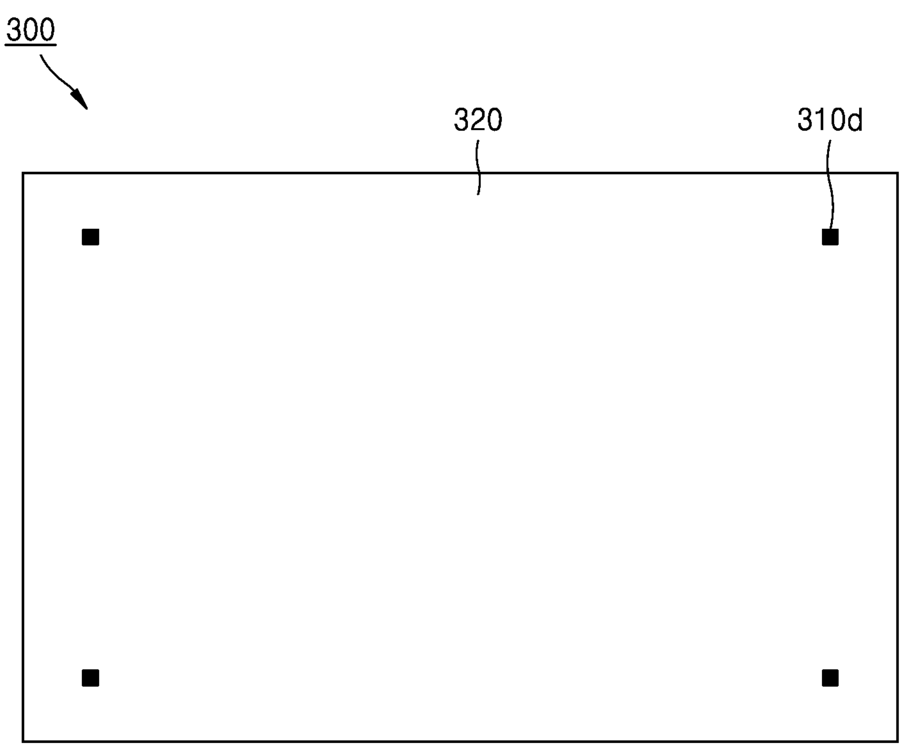
FIG. 4A is a diagram illustrating a multi-spectral image sensor and a color image sensor according to an embodiment.

FIG. 4A is a diagram illustrating a multi-spectral image sensor and a color image sensor according to an embodiment.

Referring to FIG. 4A, a diagram illustrates a modified embodiment of the multi-spectral image sensor 310 and the color image sensor 320 described in FIG. 2B.

A color image sensor 320 and a plurality of multi-spectral image sensors 310*d* may be arranged. In FIG. 4A, a plurality of multi-spectral image sensors 310*d* are intensively arranged in edge regions of the image sensor 300, but are not necessarily limited to the arrangement structure.

As depicted in FIG. 4A, the structure in which a plurality of multi-spectral image sensors 310*d* are intensively arranged in edge regions of the image sensor 300 may be suitable when photographing an object located at a long distance. When photographing an object located at a long distance, precise color coordinates and color information of the edge regions of the acquired image may be obtained to implement an elaborate color matrix and effectively correct or post-process image information based on this.

Figure 4B:
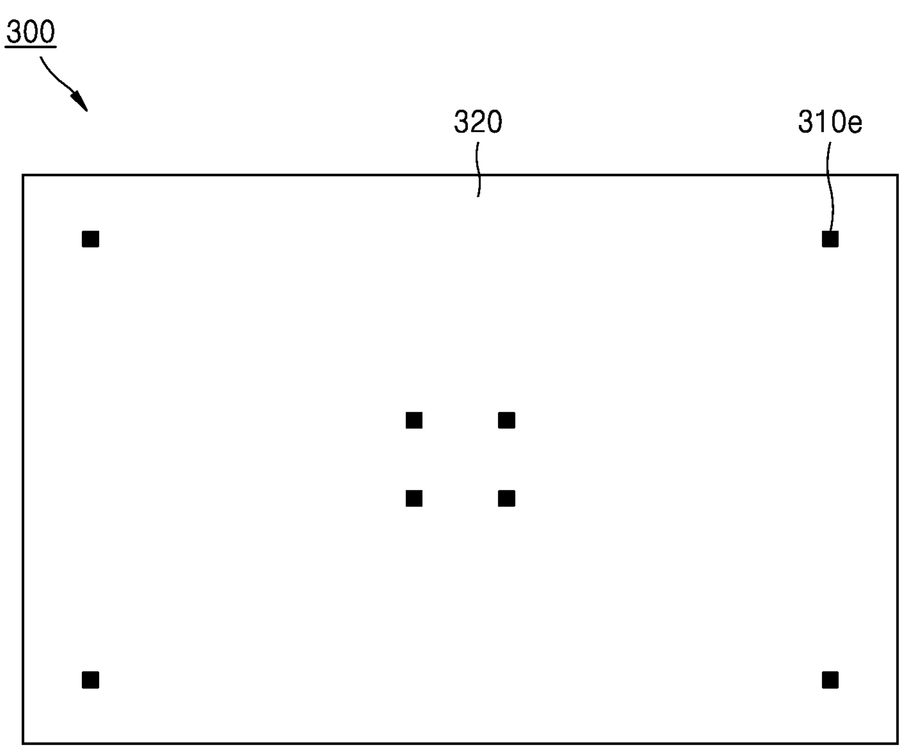
FIG. 4B is a diagram illustrating a multi-spectral image sensor and a color image sensor according to another embodiment.

FIG. 4B is a diagram illustrating a multi-spectral image sensor and a color image sensor according to another embodiment.

Referring to FIG. 4B, a diagram illustrates a modified embodiment of the multi-spectral image sensor 310 and the color image sensor 320 described in FIG. 2B.

In FIG. 4B, a plurality of multi-spectral image sensors 310*e* are intensively arranged in edge regions or a region close to a central portion of the image sensor 300, but are not necessarily limited to the arrangement structure.

As depicted in FIG. 4B, the structure in which a plurality of multi-spectral image sensors 310*e* are intensively arranged in edge regions or a region close to a central portion of the image sensor 300 may be suitable when photographing an object located at a short distance. When photographing an object located at a short distance, precise color coordinates and color information of the edge regions or a region close to a central portion of the acquired image may be obtained to implement an elaborate color matrix and effectively correct or post-process image information based on this.

In addition, since it is necessary to effectively correct different color information and color coordinates at the edge regions and central portion of the image when photographing an object and capturing an image at a short distance, the plurality of multi-spectral image sensors 310*e* are intensively distributed in the central area of the acquired image and thus each of the plurality of multispectral image sensors needs to transmit light in a narrower wavelength band to implement a color matrix.

Figure 5:
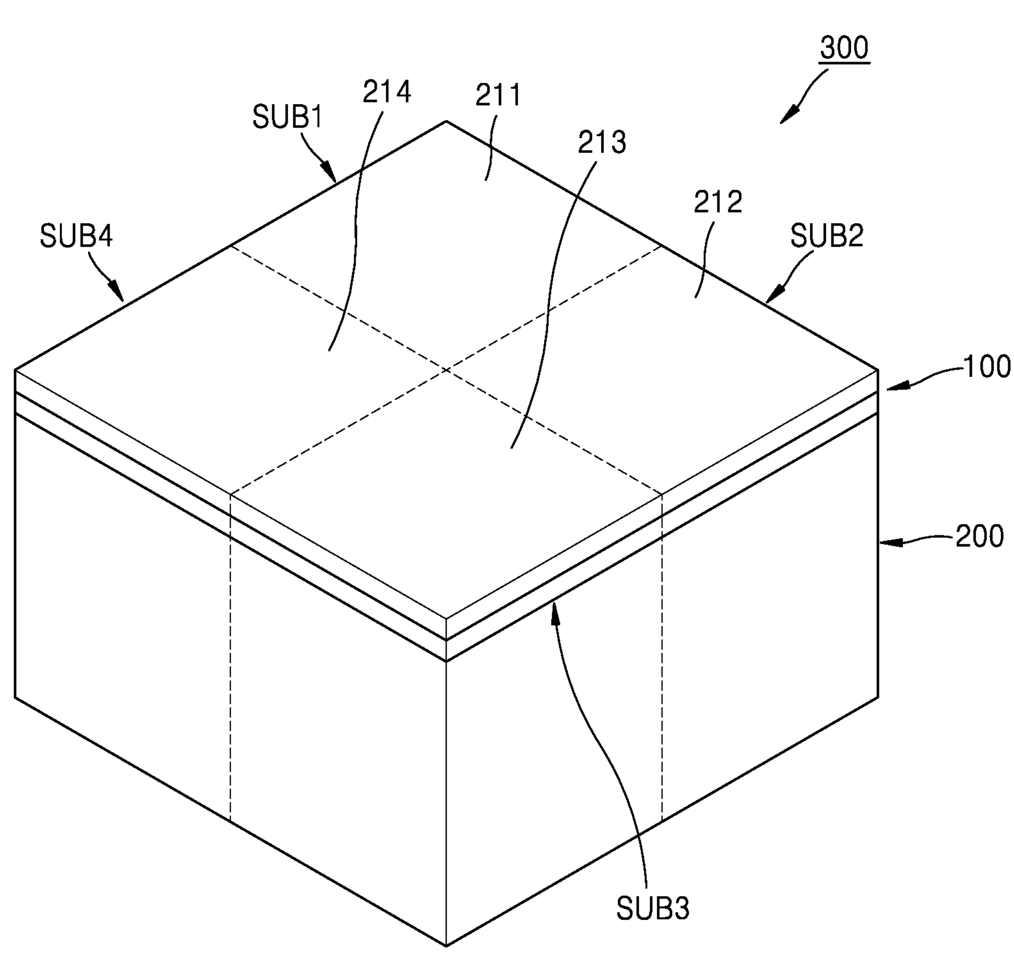
FIG. 5 is a perspective view illustrating an image sensor according to an embodiment.

FIG. 5 is a perspective view illustrating an image sensor 300 according to an embodiment.

The image sensor 300 may include a light detector 200 including a plurality of pixels (hereinafter, light detection cells) for detecting light, and a light filter 100 provided on the light detector 200. FIG. 5 illustrates a configuration corresponding to one pixel for convenience of description.

The light detector 200 may include a first light detection cell 211, a second light detection cell 212, a third light detection cell 213, and a fourth light detection cell 214 that convert light into an electrical signal. The light detector 200 may be a silicon-based photodiode.

The first light detection cell 211, the second light detection cell 212, the third light detection cell 213, and the fourth light detection cell 214 may be arranged in a 2×2 arrangement structure. This region division is for sensing incident light by dividing the region in units of sub-pixels. For example, the first light detection cell 211 may sense light of a first wavelength corresponding to a first sub-pixel SUB1, the second light detection cell 212 may sense light of a second wavelength corresponding to a second sub-pixel SUB2, the third light detection cell 213 may sense light of a third wavelength corresponding to a third sub-pixel SUB3, and the fourth sub-pixel may sense light of a fourth wavelength corresponding to the fourth sub-pixel SUB4. The first sub-pixel SUB1, the second sub-pixel SUB2, the third sub-pixel SUB3, and the fourth sub-pixel SUB4 may be blue sub-pixel, green sub-pixel, red sub-pixel, and green sub-pixel, respectively, but are not limited thereto. Although not shown in the boundary between sub-pixels, a separator may be further provided.

Since the light filter 100 is substantially the same as those described with reference to FIGS. 2A and 2B, a detailed description thereof will be omitted. The light filter 100 may transmit color light corresponding to each of the first sub-pixel SUB1, the second sub-pixel SUB2, the third sub-pixel SUB3, and the fourth sub-pixel SUB4.

Figure 6:
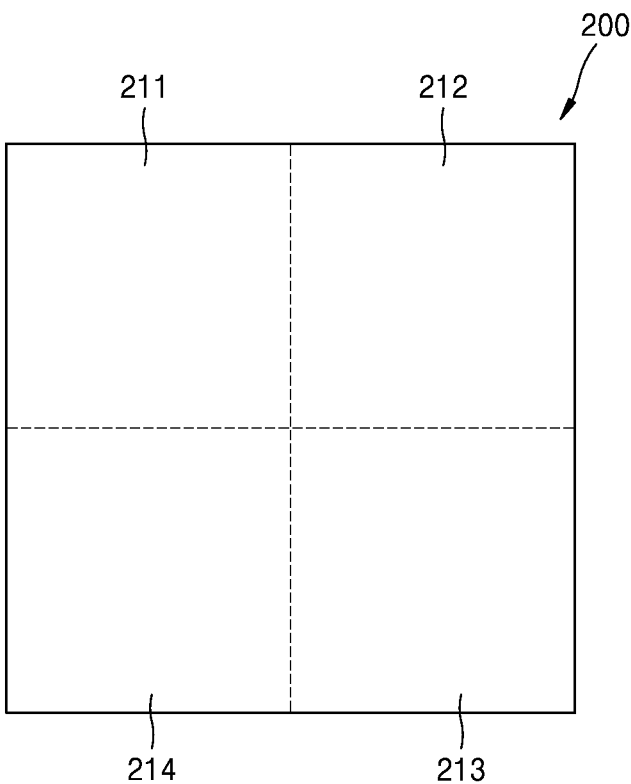
FIG. 6 schematically illustrates a structure of a light detector employed in an image sensor according to an embodiment.

FIG. 6 is a plan view of a light detector 200 employed in an image sensor 300.

The light detector 200 may include a first light detection cell 211, a second light detection cell 212, a third light detection cell 213, and a fourth light detection cell 214 that convert light into an electrical signal. The light detector 200 may be a silicon-based photodiode.

Figure 7:
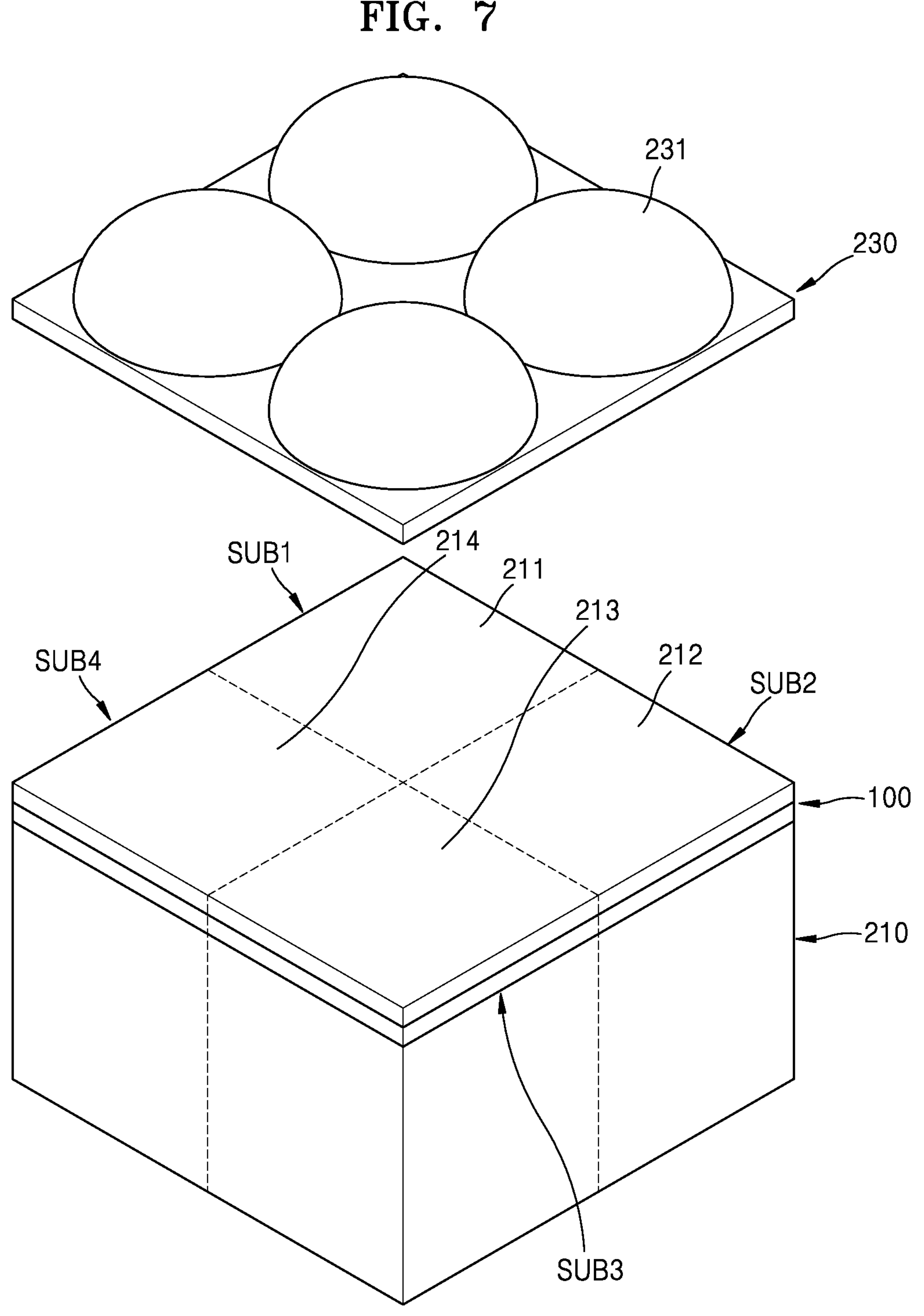
FIG. 7 illustrates an example in which a microlens array is further included in the image sensor illustrated in FIG. 6.

FIG. 7 illustrates an example in which a microlens array is further included in the image sensor illustrated in FIG. 6.

The microlens array 230 may be provided on an upper portion of the light filter 100. The microlens array 230 may include a microlens 231 arranged to correspond to each sub-pixel. The microlens 231 may concentrate incident light on a corresponding sub-pixel.

Figure 8:
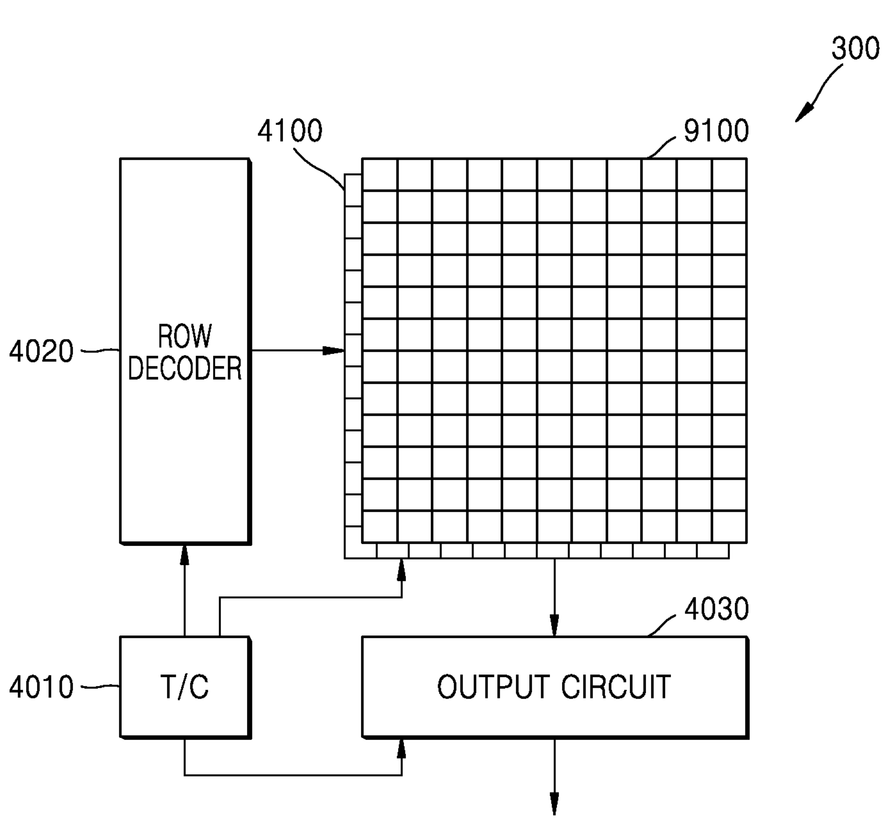
FIG. 8 is a block diagram of an image sensor according to an embodiment.

FIG. 8 is a block diagram of an image sensor according to an embodiment.

The image sensor 300 may include a light filter 100, a pixel array 4100, a timing controller 4010, a row decoder 4020, and an output circuit 4030. The image sensor may include, but is not limited to, a charge coupled device (CCD) image sensor or a complementary metal oxide semiconductor (CMOS) image sensor.

The light filter 100 may include a plurality of unit filters that transmit light in different wavelength regions and are arranged in two dimensions. The pixel array 4100 includes a plurality of pixels that sense light of different wavelengths that have transmitted through the plurality of unit filters. Specifically, the pixel array 4100 may include pixels two-dimensionally arranged along a plurality of rows and columns. The row decoder 4020 may select one of rows of the pixel array 4100 in response to a row address signal output from the timing controller 4010. The output circuit 4030 may output a light detection signal in units of columns from a plurality of pixels arranged along the selected row. To this end, the output circuit 4030 may include a column decoder and an analog-to-digital converter (ADC). For example, the output circuit 4030 may include a plurality of analog-to-digital converters (ADCs) arranged for each column between a column decoder and the pixel array 4100, or one ADC arranged at the output end of the column decoder. The timing controller 4010, the row decoder 4020, and the output circuit 4030 may be implemented as one chip or each separate chip. A processor for processing an image signal output through the output circuit 4030 may be implemented as one chip together with the timing controller 4010, the row decoder 4020, and the output circuit 4030. The pixel array 4100 includes a plurality of pixels for sensing light of different wavelengths, wherein the arrangement of the pixels may be implemented in various ways.

The image sensor 300 including the spectral filter described above may be employed in various high-performance optical devices or high-performance electronic devices. The electronic devices may be, for example, smart phones, mobile phones, portable phones, personal digital assistants (PDAs), laptops, personal computers (PCs), various portable devices, home appliances, security cameras, medical cameras, vehicles, Internet of Things (IoT) devices, other mobile or non-mobile computing devices, and are not limited thereto.

In addition to the image sensor 300, the electronic device may further include a processor that controls the image sensor, for example, an application processor (AP), and may drive an operating system or application program, through the processor, to control a number of hardware or software components and perform various data processes and operations. The processor may further include a graphical processing unit (GPU) and/or an image signal processor. When an image signal processor is included in the processor, an image (or video) obtained by the image sensor may be stored and/or output using the processor.

Figure 9:
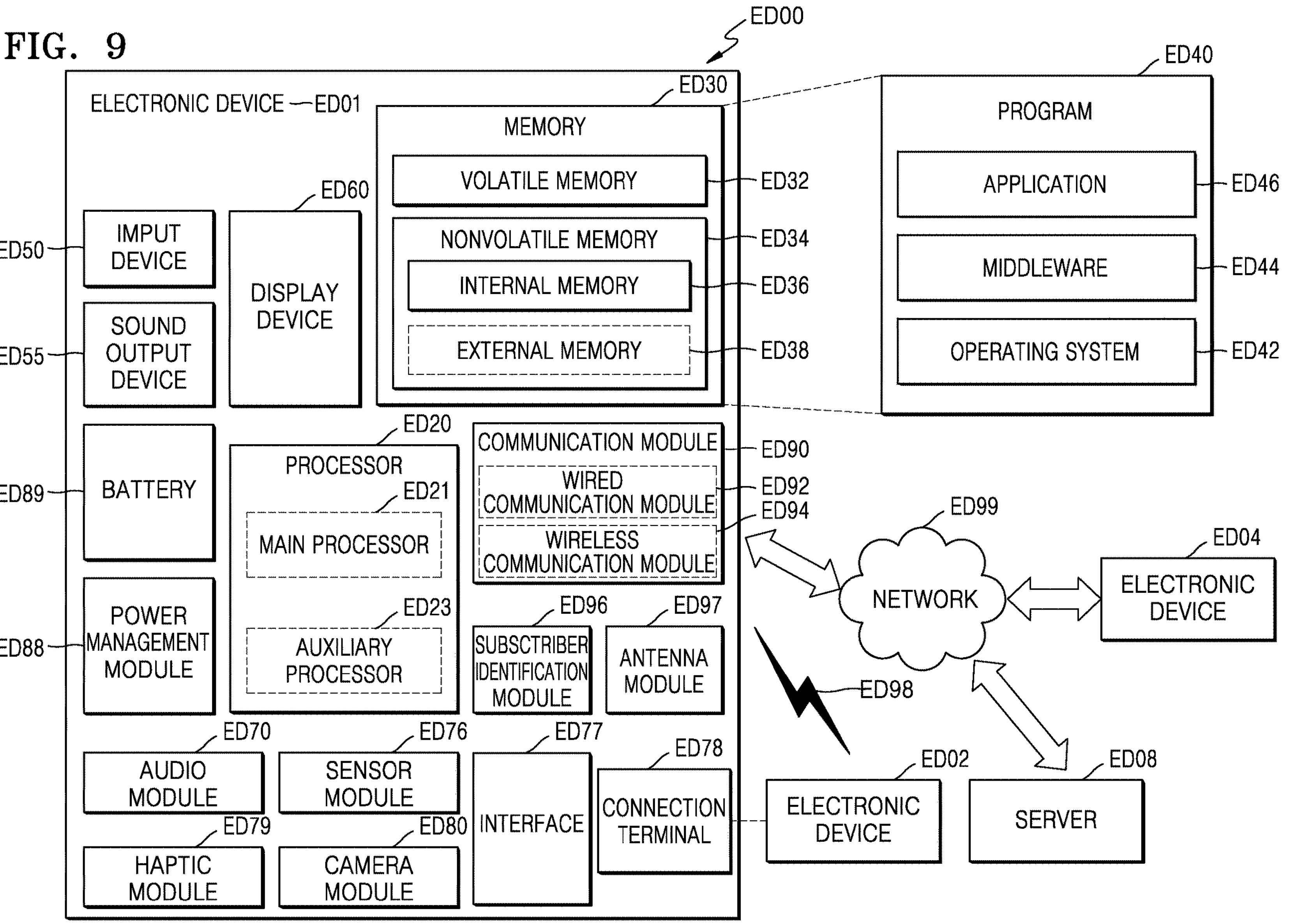
FIG. 9 is a block diagram schematically illustrating an electronic device including an image sensor according to embodiments.

FIG. 9 is a block diagram schematically illustrating an electronic device including an image sensor according to embodiments.

FIG. 9 is a block diagram illustrating an example of an electronic device ED01 including an image sensor. Referring to FIG. 9, under a network environment ED00, the electronic device ED01 may communicate with another electronic device ED02 via a first network ED98 (e.g., a short-range wireless communication network), or may communicate with another electronic device ED04 and/or a server ED08 via a second network ED99 (e.g., a long-range wireless communication network). The electronic device ED01 may communicate with the electronic device ED04 through the server ED08. The electronic device ED01 may include a processor ED20, a memory ED30, an input device ED50, an audio output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. Some (e.g., the display device ED60) of these components may be omitted from or other components may be added to the electronic apparatus ED01. Some of these components may be implemented in one integrated circuit. For example, the sensor module ED76 (e.g., fingerprint sensor, iris sensor, illuminance sensor) may be implemented by being embedded in the display device ED60 (e.g., display). In addition, when the image sensor 300 includes a spectral function, some functions (color sensor, illuminance sensor) of the sensor module may be implemented in the image sensor 300 itself, not in a separate sensor module.

The processor ED20 may execute software (e.g., program ED40) to control one or a plurality of other components (e.g., hardware, software components) of the electronic apparatus ED01 connected to the processor ED20, and may perform various data processing or operations. As part of data processing or operation, the processor ED20 may load commands and/or data received from other components (e.g., sensor modules ED76, communication modules ED90), process commands and/or data stored in volatile memory ED32, and store the result data in nonvolatile memory ED34. The processor ED20 may include a main processor ED21 (e.g., a central processing unit, an application processor) and an auxiliary processor ED23 (e.g., a graphics processing unit, an image signal processor, a sensor hub processor, a communication processor) that may be operated independently of or together with the main processor ED21. The auxiliary processor ED23 may use less power than the main processor ED21 and perform a specialized function.

The auxiliary processor ED23 may control the functionality and/or status associated with some of the components of the electronic apparatus ED01 (e.g., the display device ED60, the sensor module ED76, the communication module ED90), in place of the main processor ED21 while the main processor ED21 is in an inactive state (sleep state), or in conjunction with the main processor ED21 while the main processor ED21 is in an active state (application execution state). The auxiliary processor ED23 (e.g., image signal processor, communication processor) may be implemented as part of other functionally related components (e.g., camera module ED80, communication module ED90).

The memory ED30 may store various data required by components (processor ED20 and sensor module ED76) of the electronic apparatus ED01. The data may include, for example, input data and/or output data for software (e.g., program ED40) and related commands. The memory ED30 may include a volatile memory ED32 and/or a nonvolatile memory ED34. The nonvolatile memory ED32 may include an internal memory ED36 fixedly mounted in the electronic device ED01 and a detachable external memory ED38.

The program ED40 may be stored in the memory ED30 as software, and may include an operating system ED42, middleware ED44, and/or an application ED46.

The input device ED50 may receive commands and/or data to be used in components (e.g., processor ED20) of the electronic apparatus ED01 from the outside (e.g., user) of the electronic apparatus ED01. The input device ED50 may include a microphone, a mouse, a keyboard, and/or a digital pen (such as a stylus pen).

The sound output device ED55 may output the sound signal to the outside of the electronic apparatus ED01. The sound output device ED55 may include a speaker and/or a receiver. Speakers may be used for general purposes such as multimedia playback or recording playback, and receivers may be used to receive incoming calls. The receiver may be coupled as part of a speaker or may be implemented as an independent separate device.

The display device ED60 may visually provide information to the outside of the electronic apparatus ED01. The display device ED60 may include a display, a hologram device, or a projector and a control circuit for controlling the corresponding device. The display device ED60 may include a touch circuit configured to sense a touch, and/or a sensor circuit (e.g., a pressure sensor) configured to measure an intensity of a force generated by the touch.

The audio module ED70 may convert sound into an electrical signal or conversely convert the electrical signal into sound. The audio module ED70 may acquire sound through the input device ED50 or output sound through the sound output device ED55 and/or a speaker and/or a headphone of another electronic apparatus (e.g., electronic apparatus ED02) directly or wirelessly connected to the electronic apparatus ED01.

The sensor module ED76 may detect an operating state (e.g., power, temperature) or an external environmental state (e.g., user state) of the electronic apparatus ED01 and generate an electrical signal and/or a data value corresponding to the sensed state. The sensor module ED76 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface ED77 may support one or more designated protocols that may be used for electronic apparatus ED01 to be directly or wirelessly connected to another electronic apparatus (e.g., electronic apparatus ED02). The interface ED77 may include a high definition multimedia interface (HDMI), a universal serial bus (USB) interface, an SD card interface, and/or an audio interface.

The connection terminal ED78 may include a connector through which the electronic apparatus ED01 may be physically connected to another electronic apparatus (e.g., electronic apparatus ED02). The connection terminal ED78 may include an HDMI connector, a USB connector, an SD card connector, and/or an audio connector (such as a headphone connector).

The haptic module ED79 may convert an electrical signal to a mechanical stimulus (e.g., vibration, motion) or an electrical stimulus that a user can recognize through a tactile or motion sensation. The haptic module ED79 may include a motor, a piezoelectric element, and/or an electrical stimulus.

The camera module ED80 may capture a still image and a moving image. The camera module ED80 may include a lens assembly including one or more lenses, an image sensor 300 of FIG. 8 image signal processors, and/or flashes. The lens assembly included in the camera module ED80 may collect light emitted from an object to be photographed.

The power management module ED88 may manage power supplied to the electronic apparatus ED01. The power management module ED88 may be implemented as part of a power management integrated circuit (PMIC).

The battery ED89 may supply power to components of the electronic apparatus ED01. The battery ED89 may include a non-rechargeable primary battery, a rechargeable secondary battery, and/or a fuel cell.

The communication module ED90 may establish a direct (wired) communication channel and/or wireless communication channel between the electronic apparatus ED01 and another electronic apparatus (e.g., the electronic apparatus ED02, the electronic apparatus ED04, the server ED08), and support communication execution through the established communication channel. The communication module ED90 may include one or more communication processors that operate independently of the processor ED20 (e.g., application processor) and support direct communication and/or wireless communication. The communication module ED90 may include a wireless communication module ED92 (e.g., a cellular communication module, a short-range wireless communication module, a GNSS (Global Navigation Satellite System)) communication module, and/or a wired communication module ED94 (e.g., a local area network (LAN) communication module, a power line communication module). A corresponding communication module of these communication modules may communicate with other electronic apparatuses through a first network ED98 (a short-range communication network such as Bluetooth, WiFi Direct, or infrared data association (IrDA)), or a second network ED99 (a long-range communication network such as a cellular network, Internet, or computer network (e.g., LAN, WAN)). These various types of communication modules may be integrated into a single component (such as a single chip), or may be implemented as a plurality of separate components (multiple chips). The wireless communication module ED92 may identify and authenticate the electronic apparatus ED01 in a communication network such as a first network ED98 and/or a second network ED99 using subscriber information (such as an international mobile subscriber identifier (IMSI) stored in the subscriber identification module ED96.

The antenna module ED97 may transmit a signal and/or power to the outside (such as another electronic apparatus, etc.) or receive the signal and/or power from the outside. The antenna may include a radiator formed of a conductive pattern formed on the substrate (e.g., PCB). The antenna module ED97 may include one or a plurality of antennas. When a plurality of antennas are included, an antenna suitable for a communication scheme used in a communication network such as a first network ED98 and/or a second network ED99 may be selected from among the plurality of antennas by the communication module ED90. A signal and/or power may be transmitted or received between the communication module ED90 and another electronic apparatus through the selected antenna. Other components (e.g., RFIC) in addition to the antenna may be included as a part of the antenna module ED97.

Some of the components may be connected to each other via communication methods between peripherals (such as buses, General Purpose Input and Output (GPIO), Serial Peripheral Interface (SPI), and Mobile Industry Processor Interface (MIPI)) to interchange signals (commands, data, etc.).

The command or data may be transmitted or received between the electronic apparatus ED01 and the external electronic apparatus ED04 through the server ED08 connected to the second network ED99. Other electronic apparatuses ED02 and ED04 may be the same or different types of apparatuses as the electronic apparatus ED01. All or some of the operations executed in the electronic apparatus ED01 may be executed in one or more of the other electronic apparatuses ED02, ED04, and ED08. For example, when the electronic apparatus ED01 needs to perform a function or service, it may request one or more other electronic apparatuses to perform part or all of the function or service instead of executing the function or service on its own. One or more other electronic apparatuses receiving the request may execute an additional function or service related to the request and transmit a result of the execution to the electronic apparatus ED01. To this end, cloud computing, distributed computing, and/or client-server computing technology may be used.

Figure 10:
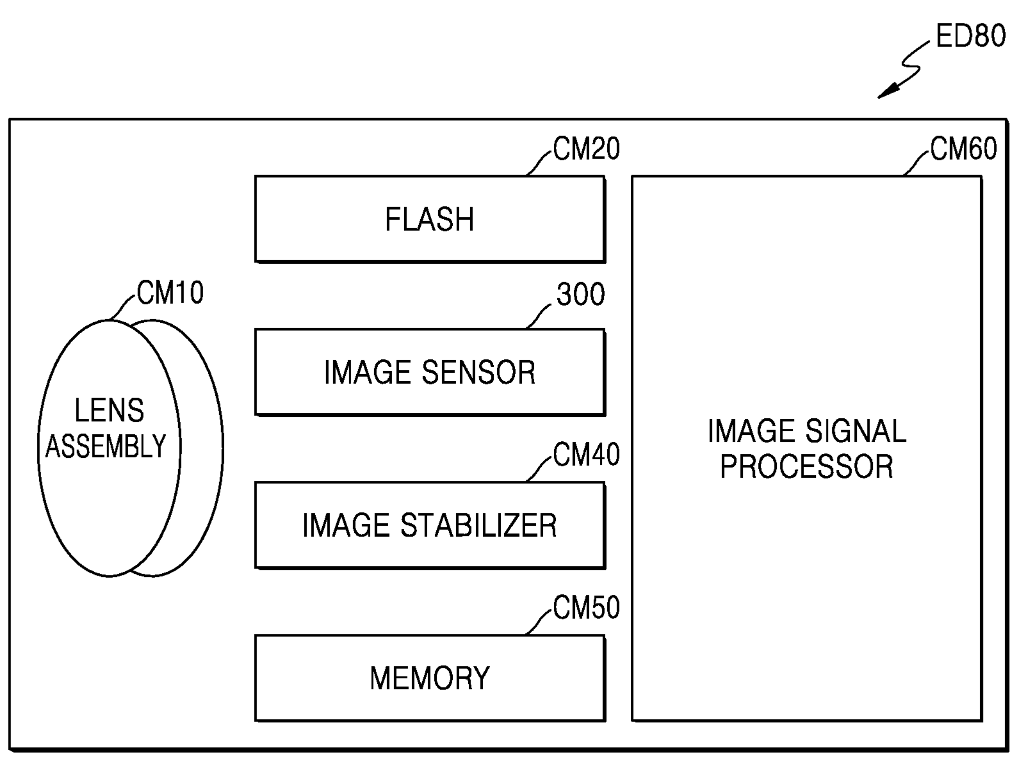
FIG. 10 is a block diagram schematically illustrating the camera module of FIG. 9.

FIG. 10 is a block diagram schematically illustrating the camera module of FIG. 9.

Referring to FIG. 10, the camera module ED80 may include a lens assembly CM10, a flash CM20, an image sensor 300, an image stabilizer CM40, a memory CM50 (e.g., a buffer memory), and/or an image signal processor CM60. The lens assembly CM10 may collect light emitted from a subject to be imaged. The camera module ED80 may include a plurality of lens assemblies CM10, and in this case, the camera module ED80 may be a dual camera, a 360-degree camera, or a spherical camera. Some of the plurality of lens assemblies CM10 may have the same lens properties (e.g., view angle, focal length, autofocus, F Number, optical zoom), or may have different lens properties. The lens assembly CM10 may include a wide-angle lens or a telephoto lens.

The flash CM20 may emit light used to enhance light emitted or reflected from the subject. The flash CM20 may include one or more light emitting diodes (RGB (Red-Green-Blue) LED, White LED, Infrared LED, Ultraviolet LED, etc.), and/or Xenon Lamps. The image sensor 300 may be an image sensor described in FIG. 8 or FIG. 10, and may obtain an image corresponding to an object by converting light emitted or reflected from the subject and transmitted through the lens assembly CM10 into an electrical signal. The image sensor 300 may include one or more sensors selected from image sensors with different properties, such as an RGB sensor, a Black and White (BW) sensor, an infrared (IR) sensor, or an ultraviolet (UV) sensor. Each of the sensors included in the image sensor 300 may be implemented as a charged coupled device (CCD) sensor and/or a Complementary Metal Oxide Semiconductor (CMOS) sensor.

In response to the movement of the camera module ED80 or the electronic device CM01 including the same, the image stabilizer CM40 may move the one or more lenses or the image sensor 300 included in the lens assembly CM10 in a specific direction or control an operation characteristic of the image sensor 300 to compensate for a negative impact caused by the movement. The image stabilizer CM40 may detect the movement of the camera module ED80 or the electronic device ED01 by using a gyro sensor (not shown) or an acceleration sensor (not shown) arranged inside or outside the camera module ED80. The image stabilizer CM40 may be implemented optically.

The memory CM50 may store some or all data of an image acquired through the image sensor 300 for a next image processing operation. For example, when multiple images are acquired at high speed, the acquired original data (e.g., Bayer-Patterned data, high-resolution data) may be stored in the memory CM50, and used to allow only low-resolution images to displayed, and then the original data of the selected image (e.g., user selection) to be transferred to the image signal processor CM60. The memory CM50 may be integrated into the memory ED30 of the electronic device ED01, or may be configured as a separate memory that operates independently.

The image signal processor CM60 may perform image processes on image obtained through the image sensor 300 or image data stored in the memory CM50. The image processes may include depth map generation, three-dimensional modeling, panorama generation, feature point extraction, image synthesis, and/or image compensation (e.g., noise reduction, resolution adjustment, brightness adjustment, blurring interpolation, sharpening, softening). The image signal processor CM60 may perform control (e.g., exposure time control, read-out timing control) on components (image sensor 300, etc.) included in the camera module ED80. The image processed by the image signal processor CM60 may be re-stored in the memory CM50 for further processing or may be provided to an external component of the camera module ED80 (e.g., memory ED30, display device ED60, electronic device ED02, electronic device ED04, server ED08). The image signal processor CM60 may be integrated into the processor ED20 or may be configured as a separate processor that operates independently of the processor ED20. When the image signal processor CM60 is configured as a separate processor from the processor ED20, the image processed by the image signal processor CM60 may be displayed through the display device ED60 after additional image processing by the processor ED20.

The electronic device ED01 may include a plurality of camera modules ED80 having different attributes or functions, respectively. In this case, one of a plurality of camera modules ED80 may be a wide-angle camera, and the other may be a telephoto camera. Similarly, one of a plurality of camera modules ED80 may be a front camera, and the other may be a rear camera.

Figure 11:
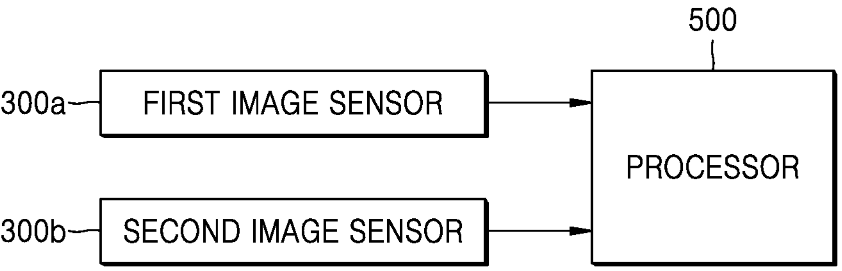
FIG. 11 is a block diagram of an embodiment with multiple image sensors.

The image sensor 300 according to embodiments may be implemented as a plurality of images sensors. For example, as shown in FIG. 11, the image sensor 300 may include a first image sensor 300*a* and a second image sensor 300*b*. The first image sensor 300*a* and the second image sensor 300*b* may be disposed in electrical communication with a processor 500.

Figure 12:
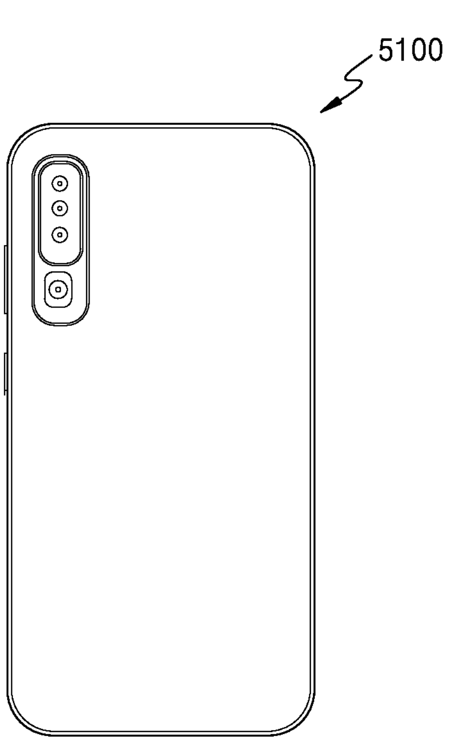
FIGS. 12-21 are diagrams illustrating various examples of electronic devices including image sensors according to embodiments.
Figure 13:
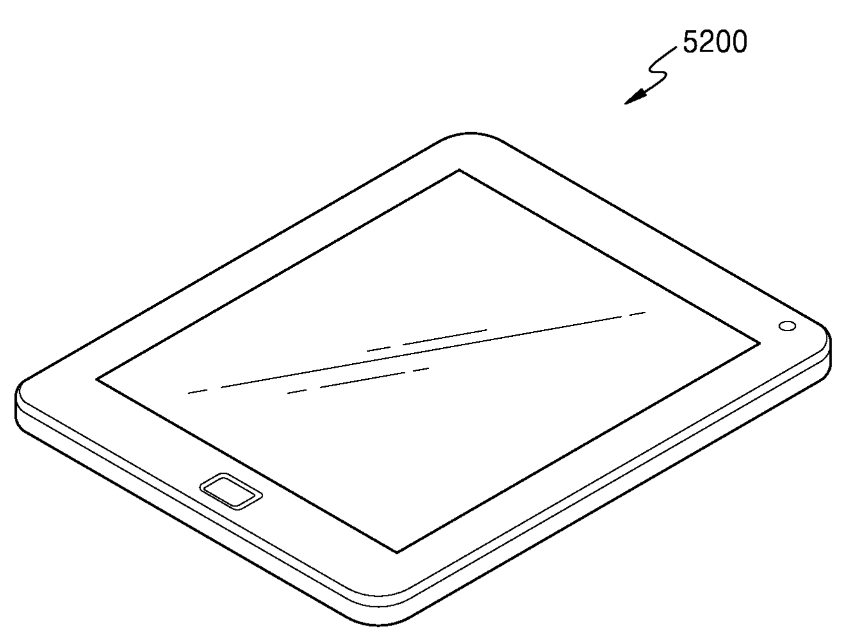
Figure 14:
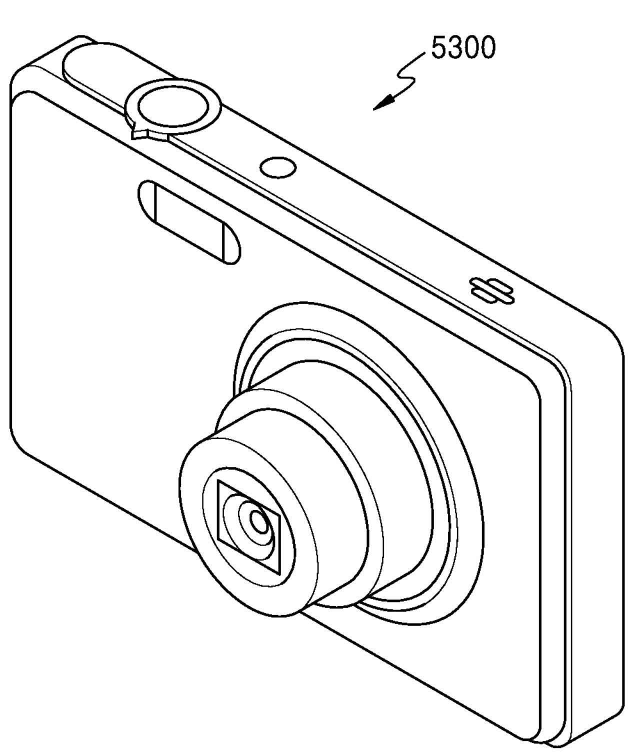
Figure 15:
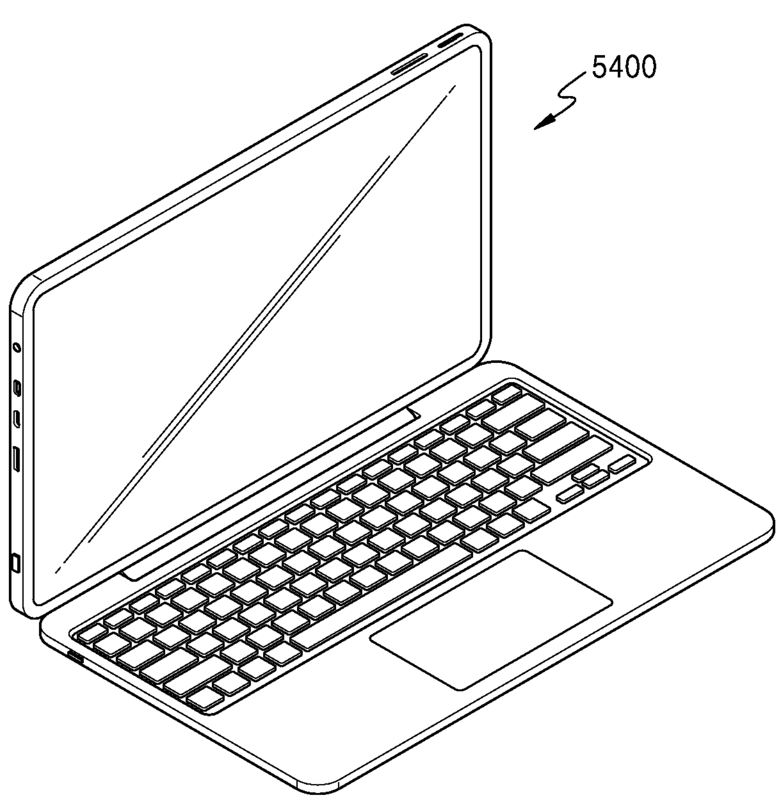
Figure 16:
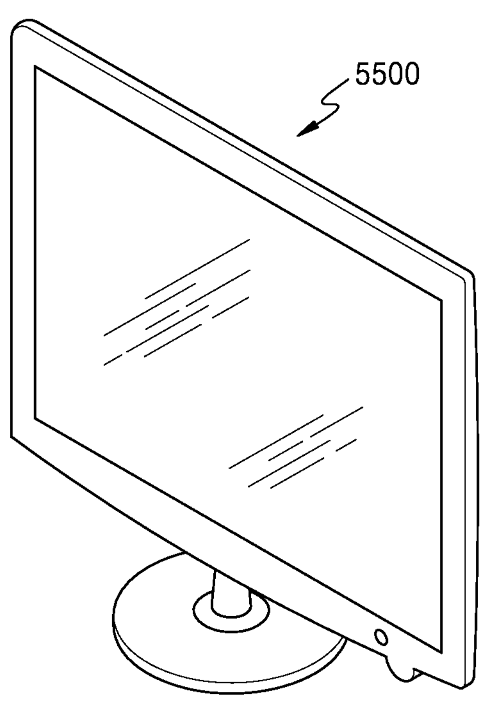

The image sensor 300 according to embodiments may be applied to the mobile phone or smart phone 5100 shown in FIG. 12, the tablet or smart tablet 5200 shown in FIG. 13, the digital camera or camcorder 5300 shown in FIG. 14, the laptop computer 5400 shown in FIG. 15, or the television or smart television 5500 shown in FIG. 16. For example, the smartphone 5100 or the smart tablet 5200 may include a plurality of high-resolution cameras each equipped with a high-resolution image sensor. It is possible to extract depth information of subjects in an image, adjust outfocusing of the image, or automatically identify subjects in the image using high-resolution cameras.

Figure 17:
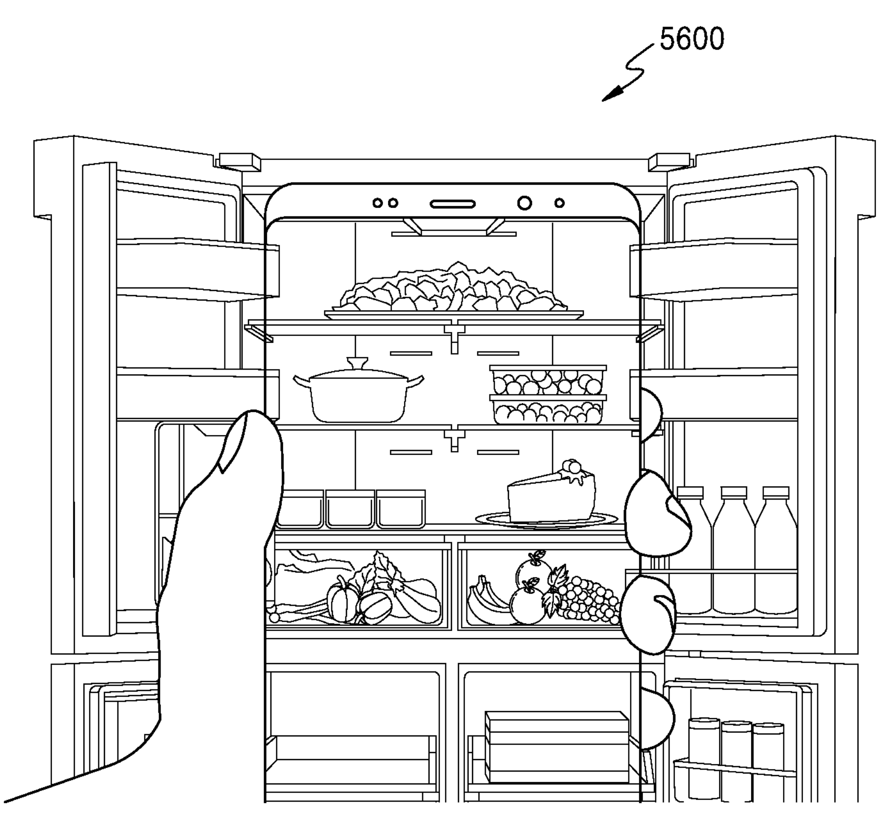
Figure 18:
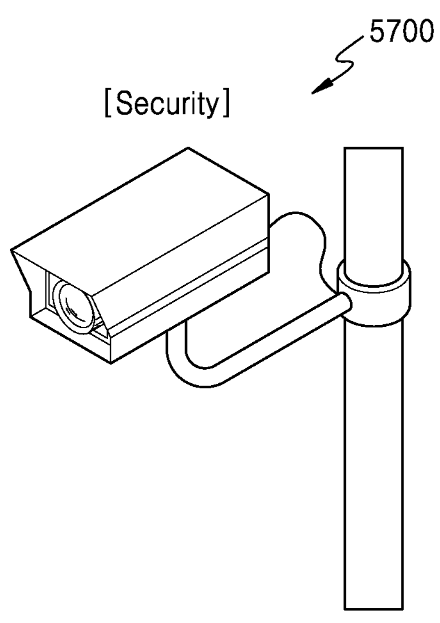
Figure 19:
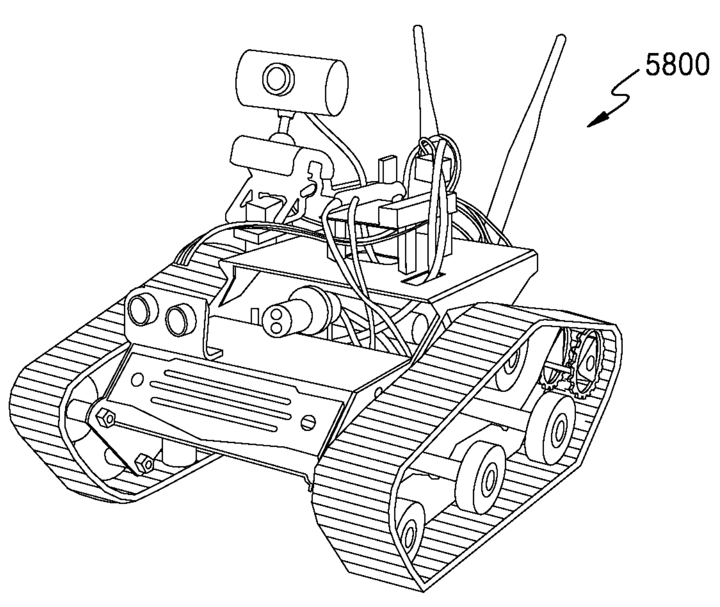
Figure 20:
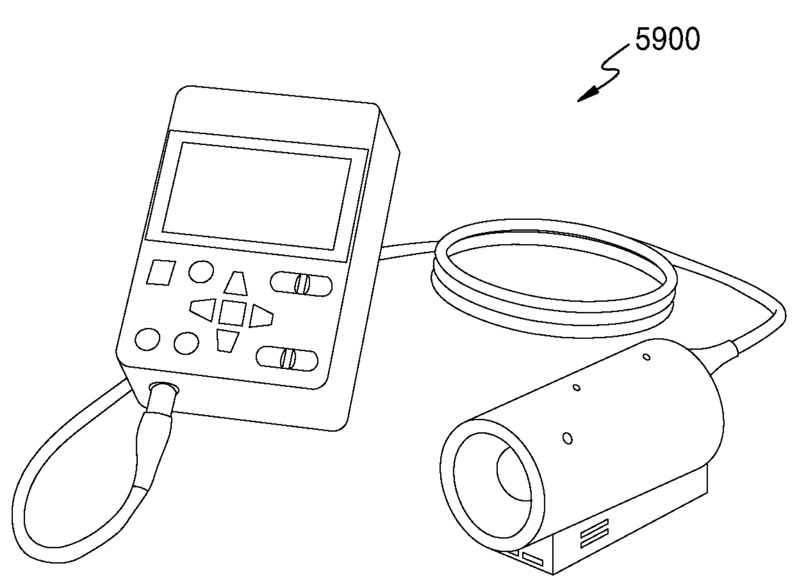

In addition, the image sensor 300 may be applied to the smart refrigerator 5600 shown in FIG. 17, the security camera 5700 shown in FIG. 18, the robot 5800 shown in FIG. 19, and the medical camera 5900 shown in FIG. 20. For example, the smart refrigerator 5600 may automatically recognize food in the refrigerator using an image sensor and inform a user of the presence of a specific food, the type of food that is received or released, and the like through a smartphone. The security camera 5700 may provide an ultra-high-resolution image and may enable recognition of objects or people in the image even in a dark environment by using high sensitivity. The robot 5800 may be provided into a disaster or industrial site that is not directly accessible by humans to provide a high-resolution image. The medical camera 5900 may provide a high-resolution image for diagnosis or surgery and may dynamically adjust the field of view.

Figure 21:
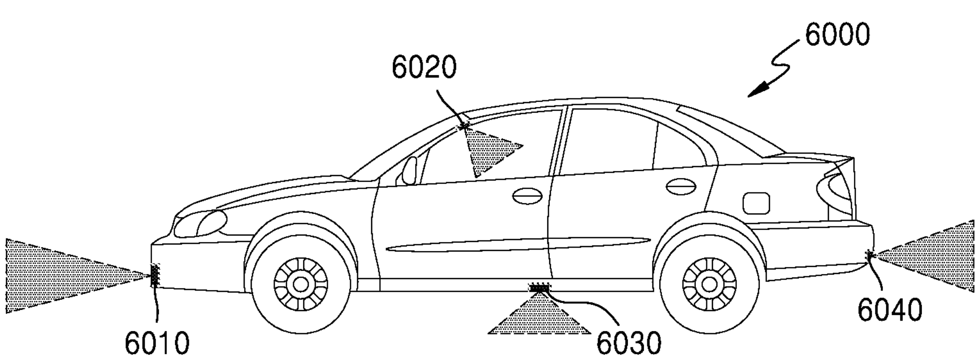

In addition, the image sensor 300 may be applied to the vehicle 6000 as illustrated in FIG. 21. The vehicle 6000 may include a plurality of vehicle cameras 6010, 6020, 6030, and 6040 arranged at various locations. Each of the vehicle cameras 6010, 6020, 6030, and 6040 may include an image sensor according to an embodiment. The vehicle 6000 may provide various information about the inside or surrounding of the vehicle 6000 to the driver using a plurality of vehicle cameras 6010, 6020, 6030, and 6040, and may automatically recognize objects or people in the image to provide information necessary for autonomous driving.

In addition, the camera module ED80 may be a combination type camera module that combines an image sensor having a conventional RGB three-color filter with a spectral image sensor composed of a spectral filter and integrates data of two combined image sensors.

Figure 22:
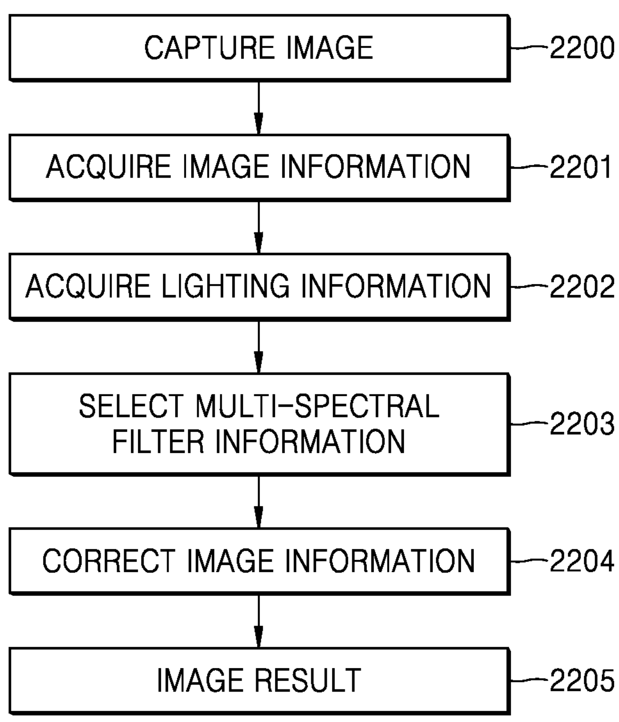
FIG. 22 is a flowchart illustrating an image correction processor and an algorithm of an image sensor according to an embodiment.

FIG. 22 is a flowchart illustrating an image correction processor algorithm of an image sensor according to an embodiment.

Referring to FIG. 22, the image correction processor algorithm includes capturing an image of an object or a thing (see step 2200), acquiring image information (2201), acquiring lighting information around the object in the image information (see step 2202), and selecting light information using a multi-spectral filter (see step 2203).

After selecting light information using a multi-spectral filter, the image correction processor algorithm may include selecting at least one of a plurality of pieces of light information through the multi-spectral filter to finally correct the image information (see step 2204) and derive the result data (see step 2205).

Using the image correction processor algorithm of FIG. 21, a more optimized color matrix may be obtained by performing calibration with multiple pieces of lighting information obtained in each cluster than a color matrix obtained by performing calibration only based on average total lighting information. Accordingly, accurate color information of the object image may be obtained.

In addition, it is possible to obtain accurate color information of the object image by selecting only necessary information from among multiple information, not necessarily processing image information by selecting all light information through multi-spectral filter.

An image sensor according to an embodiment includes a light filter and a light detector including a plurality of pixels arranged under the light filter to detect light transmitted through the light filter. The light filter has multi-spectral image sensors arranged on a co-plane together with a color filter including a plurality of red, green, and blue filters. A set (cluster) of multi-spectral image sensors includes a plurality of multi-spectral filters each containing a plurality of band filters that transmit light in different wavelength bands. Each band filter may transmit a wavelength range narrower than that of the red, green, and blue filters to sense a clearer image.

In addition, the electronic device including the image sensor according to an embodiment includes a processor for correcting an image by simultaneously processing image information and lighting information acquired by the image sensor, thereby optimizing a color conversion matrix of the acquired image information.

However, the effect of the inventive concept is not limited to the above disclosure.

Although a color filter, an image sensor, an electronic device including the same, a processor algorithm used for acquiring image information are described with reference to the embodiments illustrated in the drawings, this is merely an example, and various modifications and other equivalent embodiments are possible therefrom by those skilled in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An image sensor comprising:

a light filter; and a light detector that comprises a plurality of pixels disposed on a lower portion of the light filter, the light detector being configured to detect light at least of a visible spectrum and transmitted through the light filter, wherein the light filter comprises:

a color filter that comprises a plurality of red filters, a plurality of green filters, and a plurality of blue filters, and a plurality of multi-spectral filters disposed adjacent to and coplanar with the color filter, each of the plurality of multispectral filters comprising a plurality of band filters configured to transmit light in different wavelength bands, and wherein each of the plurality of band filters is configured to transmit light in respectively different ones of band filter wavelength ranges that are each both of the visible spectrum and narrower than wavelength ranges of each of the plurality of red filters, the plurality of green filters and the plurality of blue filters.

2. The image sensor of claim 1, wherein the light detector comprises a complementary metal oxide semiconductor (CMOS) device.

3. The image sensor of claim 1, wherein the color filter and the plurality of multi-spectral filters are disposed adjacent to and coplanar with the light detector across a cross-section of the image sensor.

4. The image sensor of claim 3, wherein the plurality of multi-spectral filters are integrally provided with the color filter as a monolithic structure or are hetero-bonded to the color filter.

5. The image sensor of claim 1, wherein each of the multi-spectral filters comprises eight to sixteen band filters which are configured to transmit light in different wavelength bands within a visible light wavelength region.

6. The image sensor of claim 1, wherein the plurality of band filters of each of the plurality of multi-spectral filters are arranged in a 4×4 matrix or 3×3 matrix.

7. The image sensor of claim 1, wherein the color filter and a first subset of the plurality of pixels that correspond to pixels disposed on a lower portion of the color filter form a color image sensor, and wherein each of the plurality of multi-spectral filters and a second subset of the plurality of pixels that correspond to pixels disposed on a lower portion of each of the plurality of multi-spectral filters form a multi-spectral image sensor.

8. The image sensor of claim 7, wherein the color image sensor is configured to acquire image information by detecting light transmitted through the color filter, and wherein the multi-spectral image sensor is configured to acquire ambient light information around the multi-spectral filter by detecting light transmitted through the multi-spectral filter.

9. The image sensor of claim 8, wherein the multi-spectral image sensor is configured to be used to optimize a color matrix by performing calibration based on the ambient light information.

10. An electronic device comprising:

an image sensor comprising:

a light filter, and a light detector that comprises a plurality of pixels disposed on a lower portion of the light filter, the light detector being configured to detect light at least of a visible spectrum and transmitted through the light filter; and a processor configured to correct image information acquired by the image sensor, wherein the light filter comprises:

a color filter that comprises a plurality of red filters, a plurality of green filters, and a plurality of blue filters, and a plurality of multi-spectral filters disposed adjacent to and coplanar with the color filter, each of the plurality of multispectral filters comprising a plurality of band filters configured to transmit light in different wavelength bands, and wherein each of the plurality of band filters is configured to transmit light in respectively different ones of band filter wavelength ranges that are each both of the visible spectrum and narrower than wavelength ranges of each of the plurality of red filters, the plurality of green filters and the plurality of blue filters.

11. The electronic device of claim 10, wherein the color filter and a first subset of the plurality of pixels that correspond to pixels disposed on a lower portion of the color filter form a color image sensor, and wherein each of the plurality of multi-spectral filters and a second subset of the plurality of pixels that correspond to pixels disposed on a lower portion of each of the plurality of multi-spectral filters form a multi-spectral image sensor.

12. The electronic device of claim 11, wherein the color image sensor is configured to acquire the image information by detecting light transmitted through the color filter, and wherein the multi-spectral image sensor is configured to acquire ambient light information around the multi-spectral filter by detecting light transmitted through the multi-spectral filter.

13. The electronic device of claim 12, wherein the processor is configured to optimize a color matrix by performing calibration based on the ambient light information acquired by the multi-spectral image sensor.

14. The electronic device of claim 13, wherein the processor being configured to correct the image information acquired by the image sensor includes being configured to correct the image information acquired by the color image sensor by using the optimized color matrix.

15. The electronic device of claim 10, wherein the light detector comprises a complementary metal oxide semiconductor (CMOS) device.

16. The electronic device of claim 10, wherein the color filter and the plurality of multi-spectral filters are disposed adjacent to and coplanar with the light detector across a cross-section of the image sensor.

17. The electronic device of claim 16, wherein the plurality of multi-spectral filters are integrally provided with the color filter as a monolithic structure or are hetero-bonded to the color filter.

18. The electronic device of claim 10, wherein each of the multi-spectral filters comprises eight to sixteen different band filters which are each configured to transmit light in respective ones of different wavelength bands of the visible spectrum, within a visible light wavelength region, and each being narrower than the wavelength ranges of each of the plurality of red filters, the plurality of green filters and the plurality of blue filters.

19. The electronic device of claim 10, wherein the plurality of band filters of each of the plurality of multi-spectral filters are arranged in a 4×4 matrix or 3×3 matrix.

20. An image sensor comprising:

a light filter;

a microlens array disposed on an upper portion of the light filter; and a light detector that comprises a plurality of pixels disposed on a lower portion of the light filter, the light detector being configured to detect light at least of a visible spectrum and transmitted through the light filter, wherein the light filter comprises:

a color filter that comprises a plurality of red filters, a plurality of green filters, and a plurality of blue filters, and a plurality of multi-spectral filters disposed adjacent to and coplanar with the color filter, each of the plurality of multispectral filters comprising a plurality of band filters configured to transmit light in different wavelength bands, wherein each of the plurality of band filters is configured to transmit light in respectively different ones of band filter wavelength ranges that are each both of the visible spectrum and narrower than wavelength ranges of each of the plurality of red filters, the plurality of green filters and the plurality of blue filters, and wherein the plurality of pixels comprise a plurality of light detection cells configured to convert incident light concentrated by the microlens array into an electrical signal.

21. The image sensor of claim 20, wherein the plurality of light detection cells comprise a first light detection cell, a second light detection cell, a third light detection cell, and a fourth light detection cell arranged in a 2×2 array, wherein the plurality of light detection cells configured to convert the incident light concentrated by the microlens array into the electrical signal includes the first light detection cell, the second light detection cell, the third light detection cell, and the fourth light detection cell being configured to convert the incident light into the electrical signal corresponding to a first sub-pixel, a second sub-pixel, a third sub-pixel, and a fourth sub-pixel respectively, and wherein the microlens array comprises a first microlens, a second microlens, a third microlens, and fourth microlens that are respectively configured to concentrate the incident light on the first light detection cell, the second light detection cell, the third light detection cell, and the fourth light detection cell.

22. The image sensor of claim 20, wherein the light detector is a silicon based photodiode.

* * * * *